(12) United States Patent
Huang et al.

(10) Patent No.: US 11,404,503 B2
(45) Date of Patent: Aug. 2, 2022

(54) DISPLAY PANEL AND MANUFACTURING METHOD THEREOF WITH PRECLEANING PROCESS USING ULTRA-VIOLET LITHOGRAPHY UNIT

(71) Applicant: Wuhan China Star Optoelectronics Semiconductor Display Technology Co., Ltd., Hubei (CN)

(72) Inventors: Yutian Huang, Hubei (CN); Hui Song, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 167 days.

(21) Appl. No.: 16/625,817

(22) PCT Filed: Sep. 23, 2019

(86) PCT No.: PCT/CN2019/107273
§ 371 (c)(1),
(2) Date: Dec. 23, 2019

(87) PCT Pub. No.: WO2021/035848
PCT Pub. Date: Mar. 4, 2021

(65) Prior Publication Data
US 2021/0335938 A1  Oct. 28, 2021

(30) Foreign Application Priority Data

Aug. 28, 2019 (CN) .......................... 201910800228.1

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0097* (2013.01); *H01L 51/56* (2013.01)

(58) Field of Classification Search
None
See application file for complete search history.

(56) References Cited

U.S. PATENT DOCUMENTS

2002/0098670 A1* 7/2002 Ashihara ............. H01L 21/2855
438/586
2005/0117078 A1* 6/2005 Lai .................... G02F 1/136213
349/38

(Continued)

FOREIGN PATENT DOCUMENTS

CN 107146771 A 9/2017
CN 107689345 A 2/2018

(Continued)

*Primary Examiner* — Nduka E Ojeh
(74) *Attorney, Agent, or Firm* — Luedeka Neely Group, PC

(57) ABSTRACT

The present invention provides a display panel and a manufacturing method of the display panel. By etching a certain amount of a protective layer in a first contact region and in a second contact region, a first via hole and a second via hole expose a surface of an active layer, and a source/drain metal layer is connected to the active layer through the first via hole and the second via hole. The present invention does not use a hydrofluoric acid cleaning machine (HFC) to rinse the protective layer, so a first capacitor electrode and a second capacitor electrode are effectively prevented from being etched by hydrofluoric acid (HF). Accordingly, stable thin-film-transistor (TFT) electrical parameters are obtained.

9 Claims, 1 Drawing Sheet

(56) References Cited

U.S. PATENT DOCUMENTS

| | | |
|---|---|---|
| 2007/0035239 A1 | 2/2007 | Kang et al. |
| 2007/0148833 A1 | 6/2007 | Im et al. |
| 2015/0349294 A1* | 12/2015 | Lee .................... H01L 27/3244 |
| | | 257/40 |
| 2017/0141169 A1* | 5/2017 | Sim .................... H01L 27/3265 |
| 2019/0013334 A1 | 1/2019 | Hu |
| 2019/0229017 A1 | 7/2019 | Liu et al. |
| 2020/0185478 A1 | 6/2020 | Yu et al. |
| 2020/0203534 A1* | 6/2020 | Park ................. H01L 29/78633 |

FOREIGN PATENT DOCUMENTS

| | | |
|---|---|---|
| CN | 109686742 A | 4/2019 |
| EP | 1753030 B1 | 5/2019 |

* cited by examiner

DISPLAY PANEL AND MANUFACTURING METHOD THEREOF WITH PRECLEANING PROCESS USING ULTRA-VIOLET LITHOGRAPHY UNIT

1. FIELD OF DISCLOSURE

The present invention relates to a field of display devices and in particular, to a display panel and a manufacturing method thereof.

2. DESCRIPTION OF RELATED ART

Low-temperature polysilicon active matrix organic light-emitting diode (LTPS-AMOLED) display devices have a stress concentration region at positions where an interlayer dielectric layer (ILD) covers a gate (GE) electrode (GE) with a height difference. The stress concentration region is easily cracked/broken in the case of multiple bending. The cracks occur at the interlayer dielectric layer in the stress concentration region and expand up and down. The Young's modulus of aluminum (Al) is about ⅓ of that of molybdenum (Mo). If the first and second capacitor electrodes are made of a titanium/aluminum/titanium laminated structure instead of the currently used molybdenum, cracking during bending can be effectively avoided, and a bending life of devices can be prolonged. In other words, the gate electrode and the source/drain metal layer are both a Ti/Al/Ti laminated structure with a small Young's modulus. In addition to that, aluminum has small electrical resistivity as small as only half of that of molybdenum, and the double-gate metal has lower resistance values under recrystallization temperature of aluminum. Moreover, because the source/drain metal layer is also a titanium/aluminum/titanium structure, its contact surfaces and upper and lower plates of the double-gate metal capacitor also obtain smaller resistance values, thereby acquiring a thin-film-transistor circuit with more excellent electrical properties.

In order to prevent the resistance of the active layer and the source/drain metal layer from being too large and to form an ohmic contact, and a hydrofluoric acid cleaning machine (HFC) is used to remove silicon oxide from a contact surface between the active layer and a source/drain electrode (this silicon oxide film is a dense oxide film formed by oxidizing polysilicon with $O_3$ in an HFC process before a first insulating layer is formed). Due to high activity of aluminum, aluminum will react with hydrofluoric acid during an HFC cleaning process, causing gate electrode metal to be corroded by hydrofluoric acid. Data/reports show metal resistance of a first and a second capacitor electrode after the HFC cleaning process is multiplied, resulting in abnormality of most electrical parameters of a thin film transistor.

Therefore, there is an urgent need for a new display panel which can reduce corrosion of the gate electrode to thereby improve stability of the electrical parameters of the display panel.

SUMMARY

The present invention is directed to providing a display panel and a manufacturing method thereof. By etching a certain amount of a protective layer in a first contact region and in a second contact region, a first via hole and a second via hole expose a surface of an active layer. The present invention does not use a hydrofluoric acid cleaning machine (HFC) to rinse the protective layer, so the present invention effectively prevents a first capacitor electrode and a second capacitor electrode from being etched by hydrofluoric acid (HF), thereby obtaining stable thin-film-transistor (TFT) electrical parameters.

Accordingly, the present invention provides a display panel, comprising:

a flexible substrate;

an active layer disposed on the flexible substrate, the active layer comprising a first contact region, a second contact region, and a functional layer connected to the first contact region and the second contact region;

a protective layer disposed on one side of the active layer away from the flexible substrate;

a first insulating layer disposed on the active layer and the flexible layer;

a first capacitor electrode disposed on one side of the first insulating layer away from the flexible substrate;

a second insulating layer disposed on the first capacitor electrode and the first insulating layer;

a second capacitor electrode disposed on one side of the second insulating layer away from the first insulating layer;

an interlayer insulating layer disposed on the second capacitor electrode and the second insulating layer; and a source/drain metal layer disposed on one side of the interlayer insulating layer away from the second insulating layer;

wherein the interlayer insulating layer is provided with a first via hole and a second via hole; the first via hole is disposed corresponding to the first contact region and passes through the interlayer insulating layer, the second insulating layer, a portion of the first insulating layer, and the protective layer until reaching a surface of the active layer; and the second via hole is disposed corresponding to the second contact region and passes through the interlayer insulating layer, the second insulating layer, a portion of the first insulating layer, and the protective layer until reaching a surface of the active layer.

The source/drain metal layer comprises a source electrode and a drain electrode; the source electrode is connected to the first contact region through the first via hole; and the drain electrode is connected to the second contact region through the second via hole.

The first capacitor electrode and the second capacitor electrode each comprise:

a first metal layer;

a second metal layer disposed on the first metal layer; and a third metal layer disposed on the second metal layer away from the first metal layer, wherein the first metal layer and the third metal layer are made of titanium (Ti), and the second metal layer is made of aluminum (Al).

The protective layer is made of silicon oxide, and a thickness of the protective layer ranges from 40 Å to 50 Å.

Material of the active layer comprises poly-silicon, and a thickness of the active layer ranges from 400 Å to 410 Å.

The flexible substrate comprises:

a base substrate;

a first base layer disposed on the base substrate;

a barrier layer disposed on one side of the first base layer away from the base substrate;

a second base layer disposed on one side of the barrier layer away from the first base layer;

a buffer layer disposed on one side of the second base layer away from the barrier layer; and an intermediate layer disposed on one side of the buffer layer away from the second base layer.

The display panel further comprises:
a planarization layer disposed on the source/drain metal layer and the interlayer insulating layer;
a first electrode disposed on one side of the planarization layer away from the interlayer insulating layer; and
a pixel definition layer disposed on the first electrode and the planarization layer;
wherein the first electrode is connected to the source/drain metal layer, the pixel definition layer has a groove, a surface of the first electrode is exposed from the groove, and a pixel defining block is disposed on the pixel definition layer and surrounds the groove.

The first electrode is connected to the source/drain metal layer.

The present invention further provides a manufacturing method of a display panel, comprising following steps:
providing a flexible substrate;
depositing an active layer on the flexible substrate, the active layer comprising a first contact region, a second contact region, and a functional layer connected to the first contact region and the second contact region;
forming a protective layer on the active layer;
depositing a first insulating layer on the active layer and the flexible substrate;
depositing a first capacitor electrode on the first insulating layer;
depositing a second insulating layer on the first capacitor electrode and the first insulating layer;
depositing a second capacitor electrode on the second insulating layer;
depositing an interlayer insulating layer on the second capacitor electrode and the second insulating layer;
defining a first via hole in the first contact region, wherein the first via hole passes through the interlayer insulating layer, the second insulating layer, a portion of the first insulating layer, and the protective layer until reaching a surface of the active layer;
defining a second via hole in the second contact region, wherein the second via hole passes through the interlayer insulating layer, the second insulating layer, a portion of the first insulating layer, and the protective layer until reaching a surface of the active layer; and
pre-cleaning the first via hole in the first contact region and pre-cleaning the second via hole in the second contact region.

The manufacturing method of the display panel further comprises sequentially depositing a source/drain metal layer, a planarization layer, a first electrode, a pixel definition layer, and a pixel defining block on the interlayer insulating layer.

Advantages of the present invention: The present invention provides a display panel and a manufacturing method thereof. By etching a certain amount of a protective layer in a first contact region and in a second contact region, a first via hole and a second via hole expose a surface of an active layer, and a source/drain metal layer is connected to the active layer through the first via hole and the second via hole. The present invention does not use a hydrofluoric acid cleaning machine (HFC) to rinse a protective layer, so the present invention effectively prevents a first capacitor electrode and a second capacitor electrode from being etched by hydrofluoric acid (HF), thereby obtaining stable thin-film-transistor (TFT) electrical parameters.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DETAILED DESCRIPTION OF EMBODIMENTS

Figure 1:
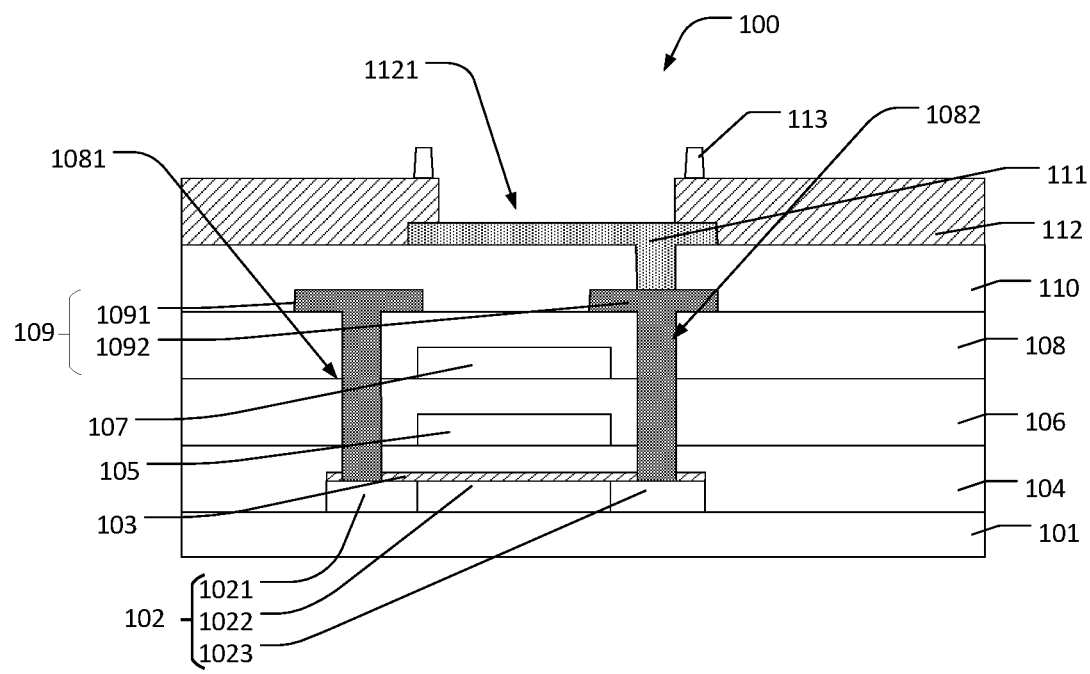
FIG. 1 is a schematic structural view illustrating a display panel of the present invention.

The following description is provided to describe specific embodiments of the present invention. Directional terms mentioned in the present invention, such as upper, lower, front, rear, left, right, inner, outer, and lateral, are merely illustrative with reference to the drawings. Ordinal numbers and sequence words that precede the name of a component, such as first and second, are only to distinguish different components. In the drawings, structurally similar elements are denoted by the same reference numerals.

Embodiments of the present invention will be described in detail herein with reference to the accompanying drawings. The present invention may be embodied in many different forms and should not be limited to the specific embodiments set forth herein. The embodiments of the present invention are provided to explain practical applications of the present invention, and those skilled in the art can understand various embodiments of the present invention and can make modifications for particular applications.

Please refer to FIG. 1. The present invention provides a display panel 100. The display panel 100 comprises a flexible substrate 101, an active layer 102, a protective layer 103, a first insulating layer 104, a first capacitor electrode 105, a second insulating layer 106, a second capacitor electrode 107, an interlayer insulating layer 108, and a source/drain metal layer 109.

Figure 2:
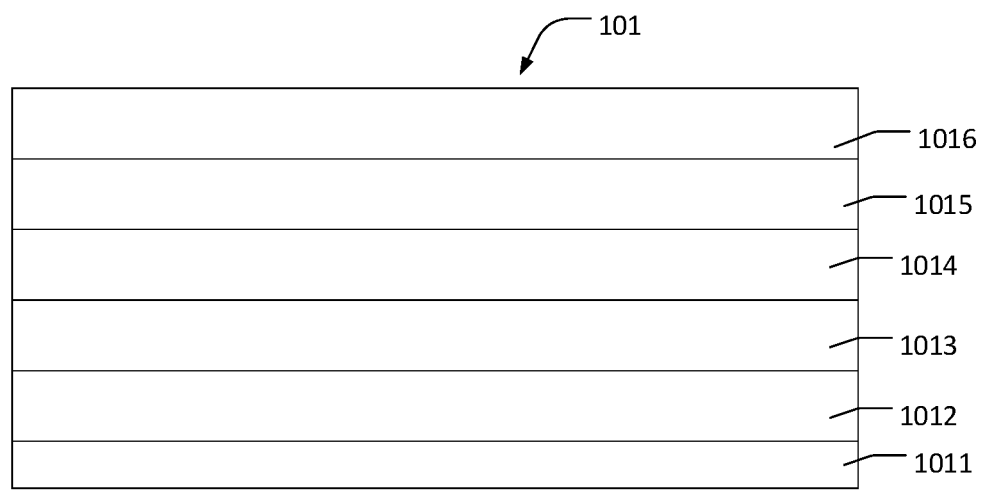
FIG. 2 is a schematic structural view illustrating a flexible substrate of the present invention.

As shown in FIG. 2, the flexible substrate 101 comprises an overlay 1011, a first base layer 1012, a barrier layer 1013, a second base layer 1014, a buffer layer 1015, and an intermediate layer 1016.

The first base layer 1012 is disposed on the overlay 1011. The first base layer 1012 is made of polyimide. The barrier layer 1013 is disposed on one side of the first base layer 1012 away from the overlay 1011.

The second base layer 1014 is disposed on one side of the barrier layer 1013 away from the first base layer 1012. The second base layer 1014 is made of polyimide.

The buffer layer 1015 is disposed on one side of the second base layer 1014 away from the barrier layer 1013.

The intermediate layer 1016 is disposed on one side of the buffer layer 1015 away from the second base layer 1014. The intermediate layer 1016 is generally used for bonding and can protect the flexible substrate 101.

As shown in FIG. 1, the active layer 102 is disposed on the flexible substrate 101. The active layer 102 comprises a first contact region 1021, a second contact region 1023, and a functional layer 1022 connected to the first contact region 1021 and the second contact region 1023.

Material of the active layer 102 comprises poly-silicon, and a thickness of the active layer 102 ranges from 400 Å to 410 Å.

The protective layer 103 is disposed on one side of the active layer 102 away from the flexible substrate 101. The protective layer 103 is made of silicon oxide, and a thickness of the protective layer 103 ranges from 40 Å to 50 Å.

The protective layer 103 is a dense oxide film formed by oxidizing poly-silicon with $O_3$.

The first insulating layer 104 is disposed on the active layer 102 and the flexible layer 101. The first capacitor electrode 105 is disposed on one side of the first insulating layer 104 away from the flexible substrate 101.

The second insulating layer 106 is disposed on the first capacitor electrode 105 and the first insulating layer 104. The second capacitor electrode 107 is disposed on one side of the second insulating layer 106 away from the first insulating layer 104.

The interlayer insulating layer 108 is disposed on the second capacitor electrode 107 and the second insulating layer 106. The interlayer insulating layer 108 is provided with a first via hole 1081 and a second via hole 1082.

The first via hole 1081 is disposed corresponding to the first contact region 1021 and passes through the interlayer insulating layer 108, the second insulating layer 106, a portion of the first insulating layer 104, and the protective layer 103 until reaching a surface of the active layer 102.

The second via hole 1082 is disposed corresponding to the second contact region 1023 and passes through the interlayer insulating layer 108, the second insulating layer 106, a portion of the first insulating layer 104, and the protective layer 103 until reaching a surface of the active layer 102.

The source/drain metal layer 109 is disposed on one side of the interlayer insulating layer 108 away from the second insulating layer 106. The source/drain metal layer 109 comprises a source electrode 1091 and a drain electrode 1092.

The present invention etches a certain amount of the protective layer 103 in the first contact region 1021 and in the second contact region 1023, so that the first via hole 1081 and the second via hole 1082 expose surfaces of the active layer 102, and the source/drain metal layer 109 is connected to the active layer 102 through the first via hole 1081 and the second via hole 1082. The present invention does not use a hydrofluoric acid cleaning machine (HFC) to rinse the protective layer 103, so the present invention effectively prevents the first capacitor electrode 105 and the second capacitor electrode 107 from being etched by hydrofluoric acid (HF), thereby obtaining stable thin-film-transistor (TFT) electrical parameters.

The source electrode 1091 is connected to the first contact region 1021 through the first via hole 1081. The drain electrode 1092 is connected to the second contact region 103 through the second via hole 1082.

The first capacitor electrode 105 and the second capacitor electrode 107 each comprise: a first metal layer, a second metal layer, and a third metal layer.

The second metal layer is disposed on the first metal layer. The third metal layer is disposed on the second metal layer away from the first metal layer.

The first metal layer and the third metal layer are made of titanium (Ti), and the second metal layer is made of aluminum (Al). Because Young's modulus of Al is about ⅕ of that of molybdenum (Mo), the present invention can effectively avoid occurrence of breakage and improve a bending life of a device. Moreover, electrical resistivity of Al is as small as only half of that of Mo, and the first capacitor electrode 105 and the second capacitor electrode 107 have lower resistance values under a recrystallization temperature of Al.

The display panel 100 further comprises a planarization layer 110, a first electrode 111, a pixel definition layer 112, and a pixel defining block 113.

The planarization layer 110 is disposed on the source/drain metal layer 109 and the interlayer insulating layer 108.

The first electrode 111 is disposed on one side of the planarization layer 110 away from the interlayer insulating layer 108. The first electrode 111 is an anode and is made of indium tin oxide. The first electrode 111 is connected to the source/drain metal layer 109.

The pixel definition layer 112 is disposed on the first electrode 111 and the planarization layer 110. The pixel definition layer 112 has a groove 1121, and a surface of the first electrode 111 is exposed from the groove 1121.

The pixel defining block 113 is disposed on the pixel definition layer 112 and surrounds the groove 1121.

The present invention provides a manufacturing method of a display panel, comprising following steps:

S1) providing a flexible substrate 101, wherein the flexible substrate 101 comprises: an overlay 1011, a first base layer 1012, a barrier layer 1013, a second base layer 1014, a buffer layer 1015, and an intermediate layer 1016.

The first base layer 1012 is disposed on the overlay 1011. The first base layer 1012 is made of polyimide. The barrier layer 1013 is disposed on one side of the first base layer 1012 away from the overlay 1011. The second base layer 1014 is disposed on one side of the barrier layer 1013 away from the first base layer 1012. The second base layer 1014 is made of polyimide. The buffer layer 1015 is disposed on one side of the second base layer 1014 away from the barrier layer 1013. The intermediate layer 1016 is disposed on one side of the buffer layer 1015 away from the second base layer 1014. The intermediate layer 1016 is generally used for bonding and can protect the flexible substrate 101.

S2) depositing an active layer 102 on the flexible substrate 101, wherein the active layer 102 comprises a first contact region 1021, a second contact region 1023, and a functional layer 1022 connected to the first contact region 1021 and the second contact region 1023.

Material of the active layer 102 comprises poly-silicon, and a thickness of the active layer 102 ranges from 400 Å to 410 Å.

S3) forming a protective layer 103 on the active layer 102, wherein the protective layer 103 is disposed on one side of the active layer 101 away from the flexible substrate 101. The protective layer 103 is made of silicon oxide, and a thickness of the protective layer 103 ranges from 40 Å to 50 Å. The protective layer 103 is a dense oxide film formed by oxidizing polysilicon with $O_3$.

S4) depositing a first insulating layer 104 on the active layer 102 and the flexible substrate 101.

S5) depositing a first capacitor electrode 105 on the first insulating layer 104.

S6) depositing a second insulating layer 106 on the first capacitor electrode 105 and the first insulating layer 104.

S7) depositing a second capacitor electrode 107 on the second insulating layer 106.

The first capacitor electrode 105 and the second capacitor electrode 107 each comprise: a first metal layer, a second metal layer, and a third metal layer.

The second metal layer is disposed on the first metal layer. The third metal layer is disposed on the second metal layer away from the first metal layer.

The first metal layer and the third metal layer are made of titanium (Ti), and the second metal layer is made of aluminum (Al). Because Young's modulus of Al is about ⅕ of that of molybdenum (Mo), the present invention can effectively avoid occurrence of breakage and improve a bending life of a device. Moreover, electrical resistivity of Al is as small as only half of that of Mo, and the first capacitor electrode 105 and the second capacitor electrode 107 have lower resistance values under a recrystallization temperature of Al.

S8) depositing an interlayer insulating layer 108 on the second capacitor electrode 107 and the second insulating layer 106;

S9) defining a first via hole 1081 in the first contact region 1021, wherein the first via hole 1081 passes through the interlayer insulating layer 108, the second insulating layer 106, a portion of the first insulating layer 104, and the protective layer 103 until reaching a surface of the active layer 102;

S10) defining a second via hole 1082 in the second contact region 1023, pre-cleaning the first via hole 1081 in the first contact region 1021 and pre-cleaning the second via hole 1082 in the second contact region 1023, wherein the second via hole 1082 passes through the interlayer insulating layer 108, the second insulating layer 106, a portion of the first insulating layer 104, and the protective layer 103 until reaching a surface of the active layer 102. The pre-cleaning process is performed by a pre-cleaning device for removing organic matter and particles on a surface of the glass.

The pre-cleaning device mainly comprises:

an ultra-violet lithography unit (EUV UNIT), wherein the EUV unit generates free oxygen radicals by irradiation of ultraviolet light, so that organic matter breaks into small molecules, and O and small molecules react to decompose into $CO_2$ and $H_2O$;

a DE/RB unit which uses a cleaning agent to remove particles and organic contaminants on a surface of the substrate by rotating a brush to rub the surface of the substrate;

a SWR unit: cleaning with deionized water to complete particle removal;

a BJ/MJK unit: by two flushing fluids, bubble breakage on the surface of the substrate produces an instantaneous local high-pressure force to wash away the particles on the surface of the substrate;

an HPMJ/FR unit: performing high-pressure micro jet cleaning with a liquid to remove particles; and an A/K unit: through an air knife, spraying dry air onto the substrate to completely dry it.

S11) sequentially depositing a source/drain metal layer 109, a planarization layer 110, a first electrode 111, a pixel definition layer 112, and a pixel defining block 113 on the interlayer insulating layer 108.

The present invention etches a certain amount of the protective layer 103 in the first contact region 1021 and in the second contact region 1023, so that the first via hole 1081 and the second via hole 1082 expose surfaces of the active layer 102, and the source/drain metal layer 109 is connected to the active layer 102 through the first via hole 1081 and the second via hole 1082. The present invention does not use a hydrofluoric acid cleaning machine (HFC) to rinse the protective layer 103, so the present invention effectively prevents the first capacitor electrode 105 and the second capacitor electrode 107 from being etched by hydrofluoric acid (HF), thereby obtaining stable thin-film-transistor (TFT) electrical parameters.

The protection scope of the present invention is not limited to the above description, and various modifications and changes can be made to the embodiments without departing from the concepts and ideas of the present invention. Such modifications and changes should be deemed to be within the protection scope of the present invention.

What is claimed is:

1. A display panel, comprising:
   a flexible substrate, wherein the flexible substrate comprises:
   a base substrate;
   a first base layer disposed on the base substrate;
   a barrier layer disposed on one side of the first base layer away from the base substrate;
   a second base layer disposed on one side of the barrier layer away from the first base layer;
   a buffer layer disposed on one side of the second base layer away from the barrier layer; and
   an intermediate layer disposed on one side of the buffer layer away from the second base layer;
   an active layer disposed on the flexible substrate, the active layer comprising a first contact region, a second contact region, and a functional layer connected to the first contact region and the second contact region;
   a protective layer disposed on one side of the active layer away from the flexible substrate, wherein the protective layer is made of silicon oxide, the protective layer only covers and is in direct contact with the active layer, and a thickness of the protective layer ranges from 40 Å to 50 Å;
   a first insulating layer disposed on the active layer and the flexible layer;
   a first capacitor electrode disposed on one side of the first insulating layer away from the flexible substrate, wherein the protective layer is spaced apart from the first capacitor electrode;
   a second insulating layer disposed on the first capacitor electrode and the first insulating layer;
   a second capacitor electrode disposed on one side of the second insulating layer away from the first insulating layer;
   an interlayer insulating layer disposed on the second capacitor electrode and the second insulating layer; and
   a source/drain metal layer disposed on one side of the interlayer insulating layer away from the second insulating layer;
   wherein the interlayer insulating layer is provided with a first via hole and a second via hole; the first via hole is disposed corresponding to the first contact region and extends through the interlayer insulating layer, the second insulating layer, a portion of the first insulating layer, and the protective layer until reaching a surface of the active layer; and the second via hole is disposed corresponding to the second contact region and passes through the interlayer insulating layer, the second insulating layer, a portion of the first insulating layer, and the protective layer until reaching a surface of the active layer.

2. The display panel according to claim 1, wherein the source/drain metal layer comprises a source electrode and a drain electrode; the source electrode is connected to the first contact region through the first via hole; and the drain electrode is connected to the second contact region through the second via hole.

3. The display panel according to claim 1, wherein the first capacitor electrode and the second capacitor electrode each comprise:
   a first metal layer;
   a second metal layer disposed on the first metal layer; and
   a third metal layer disposed on the second metal layer away from the first metal layer,
   wherein the first metal layer and the third metal layer are made of titanium (Ti), and the second metal layer is made of aluminum (Al).

4. The display panel according to claim 1, wherein material of the active layer comprises poly-silicon, and a thickness of the active layer ranges from 400 Å to 410 Å.

5. The display panel according to claim 1, further comprising:
a planarization layer disposed on the source/drain metal layer and the interlayer insulating layer;
a first electrode disposed on one side of the planarization layer away from the interlayer insulating layer; and
a pixel definition layer disposed on the first electrode and the planarization layer;
wherein the first electrode is connected to the source/drain metal layer, the pixel definition layer has a groove, a surface of the first electrode is exposed from the groove, and a pixel defining block is disposed on the pixel definition layer and surrounds the groove.

6. The display panel according to claim 5, wherein the first electrode is connected to the source/drain metal layer.

7. The display panel according to claim 1, wherein the first base layer and the second base layer are made of polyimide.

8. A manufacturing method of a display panel, comprising following steps:
providing a flexible substrate;
depositing an active layer on the flexible substrate, the active layer comprising a first contact region, a second contact region, and a functional layer connected to the first contact region and the second contact region;
forming a protective layer on the active layer;
depositing a first insulating layer on the active layer and the flexible substrate;
depositing a first capacitor electrode on the first insulating layer;
depositing a second insulating layer on the first capacitor electrode and the first insulating layer;
depositing a second capacitor electrode on the second insulating layer;
depositing an interlayer insulating layer on the second capacitor electrode and the second insulating layer;
defining a first via hole in the first contact region, wherein the first via hole passes through the interlayer insulating layer, the second insulating layer, a portion of the first insulating layer, and the protective layer until reaching a surface of the active layer;
defining a second via hole in the second contact region, wherein the second via hole passes through the interlayer insulating layer, the second insulating layer, a portion of the first insulating layer, and the protective layer until reaching a surface of the active layer; and
pre-cleaning the first via hole in the first contact region and pre-cleaning the second via hole in the second contact region, wherein the pre-cleaning step is performed using an ultra-violet lithography unit (EUV UNIT).

9. The manufacturing method of the display panel according to claim 8, further comprising sequentially depositing a source/drain metal layer, a planarization layer, a first electrode, a pixel definition layer, and a pixel defining block on the interlayer insulating layer.

* * * * *